United States Patent
Choi et al.

(10) Patent No.: US 7,170,158 B2
(45) Date of Patent: Jan. 30, 2007

(54) DOUBLE-SIDED CIRCUIT BOARD AND MULTI-CHIP PACKAGE INCLUDING SUCH A CIRCUIT BOARD AND METHOD FOR MANUFACTURE

(75) Inventors: Hee Kook Choi, Cheonan (KR); Cheol Joon Yoo, Cheonan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/186,101

(22) Filed: Jun. 27, 2002

(65) Prior Publication Data

US 2003/0015782 A1    Jan. 23, 2003

(30) Foreign Application Priority Data

Jun. 29, 2001    (KR) ............................... 2001-38191

(51) Int. Cl.
*H01L 23/02*    (2006.01)

(52) U.S. Cl. .................. 257/686; 257/685; 257/676; 257/666; 257/787; 425/116; 249/90; 249/93; 264/272.17

(58) Field of Classification Search ............... 257/666, 257/686, 685, 676, 621, 774, E21.504, 787; 425/116; 249/90, 93, 95; 264/272.17, 328.5; 174/52.2; 361/760
See application file for complete search history.

(56) References Cited

U.S. PATENT DOCUMENTS

| | | | |
|---|---|---|---|
| 5,239,198 A | 8/1993 | Lin et al. ............... | 257/693 |
| 5,273,938 A | 12/1993 | Lin et al. ............... | 438/107 |
| 5,395,226 A * | 3/1995 | Sakai et al. ............ | 425/116 |
| 5,527,740 A * | 6/1996 | Golwalkar et al. ...... | 29/827 |
| 5,545,922 A | 8/1996 | Golwalkar et al. ...... | 257/676 |
| 5,594,626 A | 1/1997 | Rostoker et al. ........ | 361/784 |
| 5,635,671 A | 6/1997 | Freyman et al. ........ | 174/52.2 |
| 5,679,978 A * | 10/1997 | Kawahara et al. ....... | 257/697 |
| 5,684,327 A * | 11/1997 | Nakazawa et al. ...... | 257/667 |
| 5,780,779 A * | 7/1998 | Kitamura et al. ....... | 177/105 |
| 5,815,372 A * | 9/1998 | Gallas .................... | 361/760 |

(Continued)

FOREIGN PATENT DOCUMENTS

JP    56048155 A  *  5/1981

(Continued)

OTHER PUBLICATIONS

Foreign office action.

(Continued)

*Primary Examiner*—Kenneth Parker
*Assistant Examiner*—Chris C. Chu
(74) *Attorney, Agent, or Firm*—Harness, Dickey & Pierce, P.L.C.

(57) ABSTRACT

A multi-chip package comprises a double-sided circuit board having first and second surfaces. Each surface has a package area and a peripheral area. Each package area has a chip mounting area on which a chip is attached, and a bonding area with which the chip is electrically connected. The peripheral area of the first surface has a runner area on which molding compound flows, and the peripheral area of the second surface has external connection pattern with which the bonding areas are electrically connected. In particular, the circuit board has gate holes, which are co-located on each surface to result in a common hole.

15 Claims, 7 Drawing Sheets

U.S. PATENT DOCUMENTS

| | | | | |
|---|---|---|---|---|
| 5,917,242 | A | 6/1999 | Ball | 257/737 |
| 5,981,873 | A | 11/1999 | Heo | 174/52.2 |
| 6,441,495 | B1 | 8/2002 | Oka et al. | 257/777 |
| 6,489,687 | B1 | 12/2002 | Hashimoto | 257/777 |

FOREIGN PATENT DOCUMENTS

| | | |
|---|---|---|
| JP | 11-111758 | 4/1999 |
| JP | 11-135537 | 5/1999 |
| KR | 1999-0083610 | 11/1999 |
| WO | WO 96/13855 | 5/1996 |
| WO | WO 01/26155 | 12/2001 |

OTHER PUBLICATIONS

Hiraiwa, K. et al., "Advanced LSI Packaging Technologies", *FUJITSU Sci. Tech. J.*, 36,1 (2000) pp. 99-107.

German Office Action dated Nov. 15, 2006.

* cited by examiner

DOUBLE-SIDED CIRCUIT BOARD AND MULTI-CHIP PACKAGE INCLUDING SUCH A CIRCUIT BOARD AND METHOD FOR MANUFACTURE

BACKGROUND OF THE INVENTION

1. Field of the Invention

The present invention relates to a semiconductor chip packaging technique and more particularly to a double-sided circuit board and a multi-chip package including the circuit board.

2. Description of the Related Art

Since recent trends in electronics development have been toward miniaturization and high performance, chips (integrated circuits) are more integrated. In addition, different types of chips need to be contained in a single package body, in order to achieve various semiconductor devices. In order to satisfy these pressing demands, a multi-chip packaging technique is applied.

Figure 1:
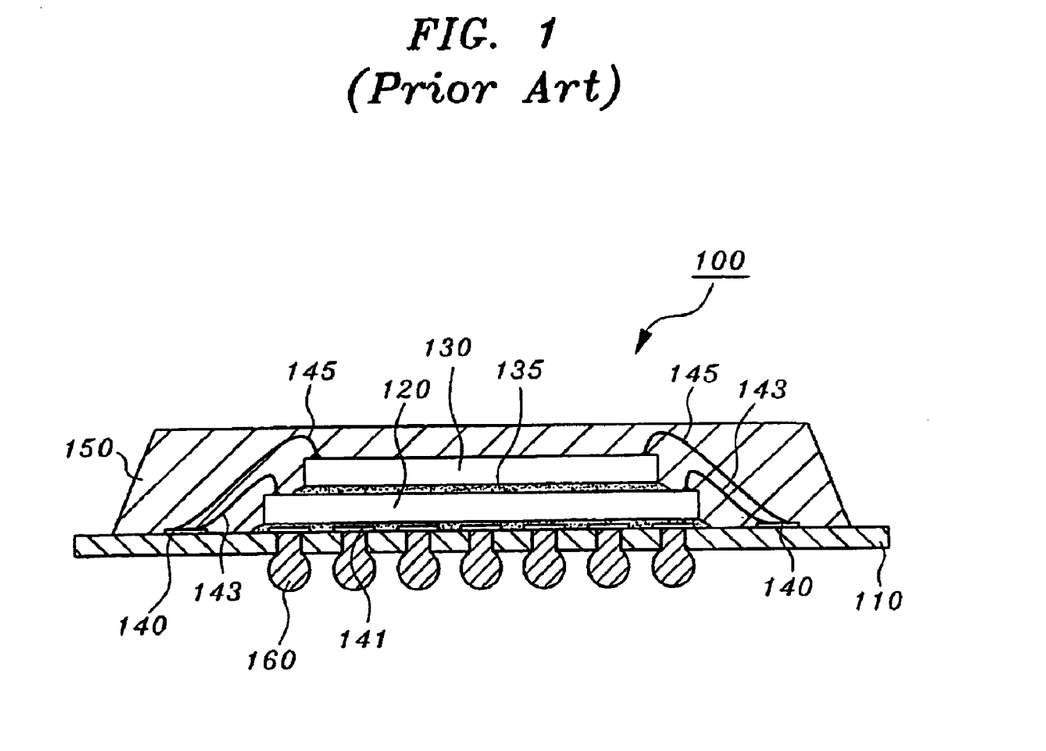
FIG. 1 is a sectional view showing a conventional multi-chip package using a circuit board.

FIG. 1 is a sectional view showing a conventional multi-chip package using a circuit board.

A conventional multi-chip package 100 is a fine-pitch ball grid array (FBGA). A first chip 120 is attached to a first surface of a circuit board 110, and a second chip 130 is attached to the first chip 120 with an adhesive tape 135. The first chip 120 and the second chip 130 are electrically connected to bonding pads 140 by bonding wires 143, 145 which are formed on the circuit board 110. The conventional FBGA multi-chip package 100 uses a chip stacking technique and a wire bonding technique.

The first and second chips 120, 130 and the bonding wires 143, 145 are protected by package body 150 of molding compound. A plurality of solder balls 160 is attached on the second surface of the circuit board 110. The solder balls 160 are connected to solder ball pads 141, which are formed on the first surface of the circuit board 110, thereby electrically connecting the multi-chip package 100 with a mother-board or other electrical devices.

In the conventional multi-chip package 100, adhesive tape 135, which is used for attaching the second chip 130 to the first chip 120, does not encroach upon the wire bonding area of the first chip 120. Therefore, the second chip 130 must be smaller than the first chip 120. Since the second chip 130 is distant from the bonding pads 140 of the circuit board 110, the bonding wire 145 must be formed in an almost straight-lined loop, so as to shorten the length of the bonding wires 145. Accordingly, it requires an additional apparatus and technique for the wire bonding process.

SUMMARY OF THE INVENTION

The present invention provides a circuit board that embodies a multi-chip package without requiring necessarily a special wiring technique and apparatus.

Further, the present invention provides a multi-chip package that can easily be embodied regardless of the size of the chips and circuit board.

Additionally, the present invention provides a multi-chip package manufactured using wire bonding techniques and molding techniques which are used in conventional plastic packaging processes.

Also, the present invention provides a multi-chip package that has a thin width regardless of the stacked chips and the circuit board used in such multi-chip packages.

A multi-chip package according to the present invention provides chips mounted to two obverse sides of a circuit board. These chips may be mounted in recesses in the board. This mounting arrangement allows for chips of differing sizes to be mounted without the concerns raised by chip stacking methods. The chips may be mounted in package areas which have both a chip mounting area and a bonding area used to electrically connect a mounted chip to the circuit board. The circuit board may also have a peripheral area and may provide for a connection area which is used to connect the chip or chips to external devices or other electrical connections. The circuit board surfaces may have gate holes which are co-located on each surface to result in a through hole in the board.

The gate hole allows for the encapsulation of the chips in a molding compound to occur on both sides of the board in one molding process that uses a molding die over each of the two circuit board surfaces. The molding dice may enter the gate holes to some extent to form a gate neck which enhances the strength of the gate hole area after the molding process.

The circuit board according to the present invention supports the fabrication of the multi-chip package as described above.

BRIEF DESCRIPTION OF THE DRAWINGS

These and other objects, features and advantages of the present invention will be readily understood with reference to the following detailed description thereof provided in conjunction with the accompanying drawings, wherein like reference numerals designate like structural elements, and, in which:

FIG. 7b is a partially enlarged sectional view of a position C of the molding die of FIG. 7a;

DETAILED DESCRIPTION OF THE PREFERRED EMBODIMENTS

Preferred embodiments of the present invention will be described below with reference to the accompanying drawings.

Figure 2:
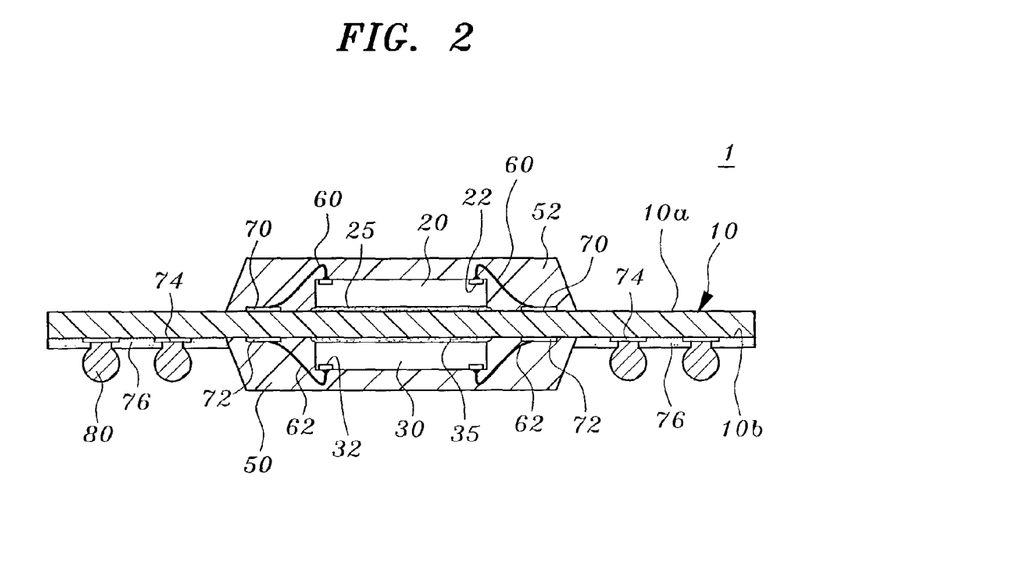
FIG. 2 is a sectional view showing a multi-chip package using a double-sided circuit board according to one embodiment of the present invention.

In some embodiments, as shown in FIG. 2 a multi-chip package is manufactured using a double-sided circuit board. A multi-chip package 1 comprises a circuit board 10, chips 20, 30, package bodies 50, 52, bonding wires 60, 62 and solder balls 80. The circuit board 10 has a first surface 10a and a lower surface 10b. Circuit board 10 is a printed circuit board with dielectric layers and wiring patterns thereon in some embodiments. The dielectric layers may comprise FR-4 material and glass fiber and the wiring patterns are made of copper.

The first chip 20 is attached to the first surface 10a with an adhesive tape 25 and the second chip 30 is attached to the second surface 10b with an adhesive tape 35 or other methods. The same or different types of chips may be used. For example, the Flash memory and SRAM or logic IC and memory chip may both be in one multi-chip package. The adhesive tapes 25, 35 may be silver filled epoxy compound adhesive. A substrate area to which the first and second chip 20, 30 are attached, may be plated with nickel(Ni) and platinum(Pt) in order to increase the adhesion force. The electrode pads 22 of the first chip 20 are electrically connected with bonding pads 70 by wires 60,62. Bonding pads 70 are formed on the first surface 10a of the circuit board 10. The electrode pads 32 of the second chip 30 are also electrically connected with bonding pads 72, which are formed on the second surface 10b of the circuit board 10. The bonding pads 70, 72 may be formed by photolithography using copper.

The first and second chip 20, 30 and bonding wire 60, 62 are sealed by package body 50, 52 in order to protect them from external environmental stress. The package bodies 50, 52 are made of epoxy molding compound (EMC) and are simultaneously formed by a transfer molding process (or an injection molding process) at the same time. This molding process is described below.

External connection pattern 74 is formed on the second surface 10b of the circuit board 10 and may serve as an electrical connection means for electrically connecting the multi-chip package 1 to an external apparatus. The solder bump area 80 is formed on the external connection patterns 74. The external connection patterns 74 are exposed from a solder mask 76 coated on the second surface 10b of the circuit board 10. A solder ball is mounted on the exposed external connection patterns 74 and heated by reflow-soldering, thereby forming the solder bump area 80.

Since the above-identified multi-chip package 1 of the first embodiment of the present invention comprises dies mounted on both surfaces of the circuit board 10, multi-chip packages can be achieved regardless of the die size, Further, the multi-chip package 1 may be manufactured by using conventional wire bonding and injection molding techniques, thereby being able to achieve mass-production. Moreover since the chips are closer to the bonding pads, additional wire looping technique is not required.

Figure 3:
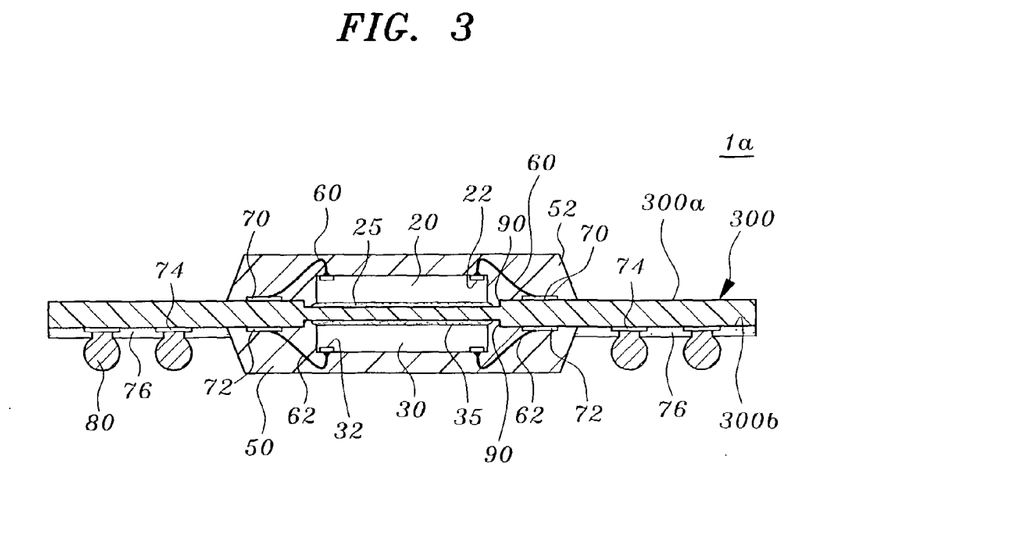
FIG. 3 is a sectional view showing a multi-chip package using a double-sided circuit board according to another embodiment of the present invention.

FIG. 3 is a sectional view showing a multi-chip package using a double-sided circuit board according to another embodiment of the present invention.

The same elements are represented with the same reference numerals in both FIG. 2 and FIG. 3.

As shown in FIG. 3, the multi-chip package 1a has recess 90 on the first surface 300a and the second surface 300b. This recess 90 is located on both sides of the circuit board in some embodiments. The first and second chips 20, 30 are mounted in recesses 90 by means of adhesive tape 25, 35.

With such an embodiment it is possible to decreases the total thickness of the package and to increase the reliability of bonding wires. The recess 90 is formed on the circuit board 300 of FIG. 4.

Figure 4:
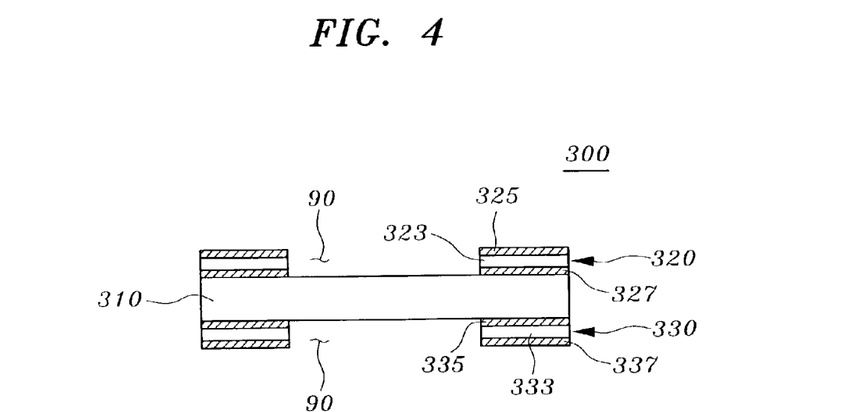
FIG. 4 is a detailed sectional view showing the circuit board used in the multi-chip package of FIG. 3.

FIG. 4 is a detailed section view showing a circuit board which is suited to be used in the manufacture of the multi-chip package of FIG. 3 according to one embodiment of the present invention.

Like a conventional circuit board, the circuit board 300 may comprise BT prepreg 310 and a first and second BT CCL(Bisamaleimide-Triazine copper clad laminate) 320, 330 attached to the upper and lower surface of the BT prepreg. The first BT CCL 320 has copper foils 325, 327, which are attached to both sides of the BT compound 323, and the second BT CCL 330 also has copper foils 335, 337, which are attached to both sides of the BT compound 333. The first and second BT CCL 320, 330 have the hole on the center. The hole, formed by a punching process, has the same size as the chip mounting area and becomes to the recess 90 on the circuit board 300.

Figure 5:
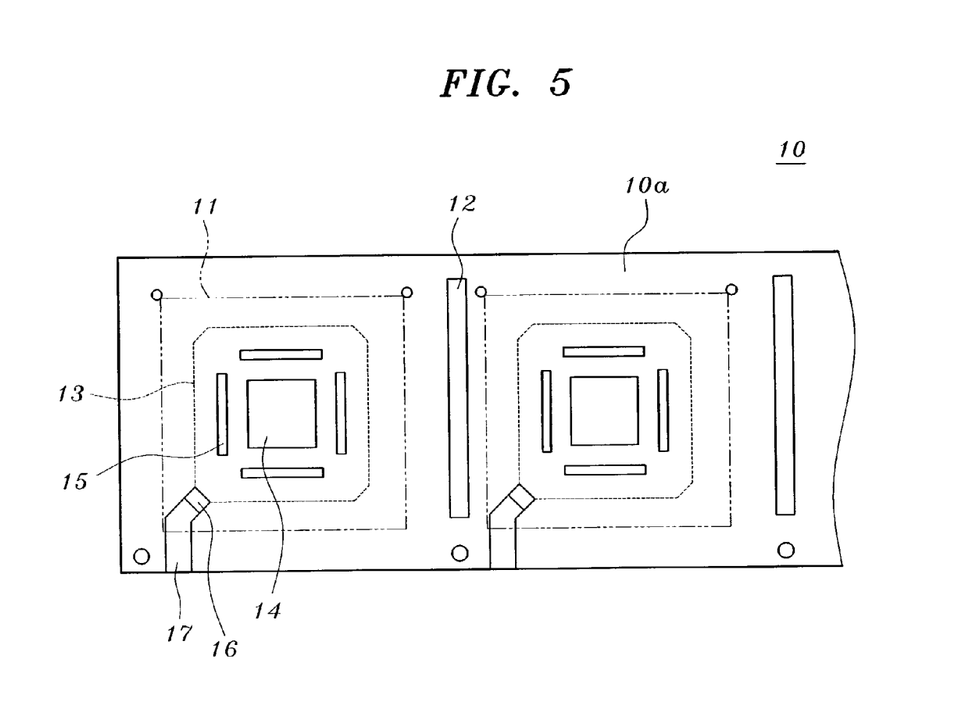
FIG. 5 is a plan view showing the first surface of a double-sided circuit board according to one embodiment of the present invention.
Figure 6:
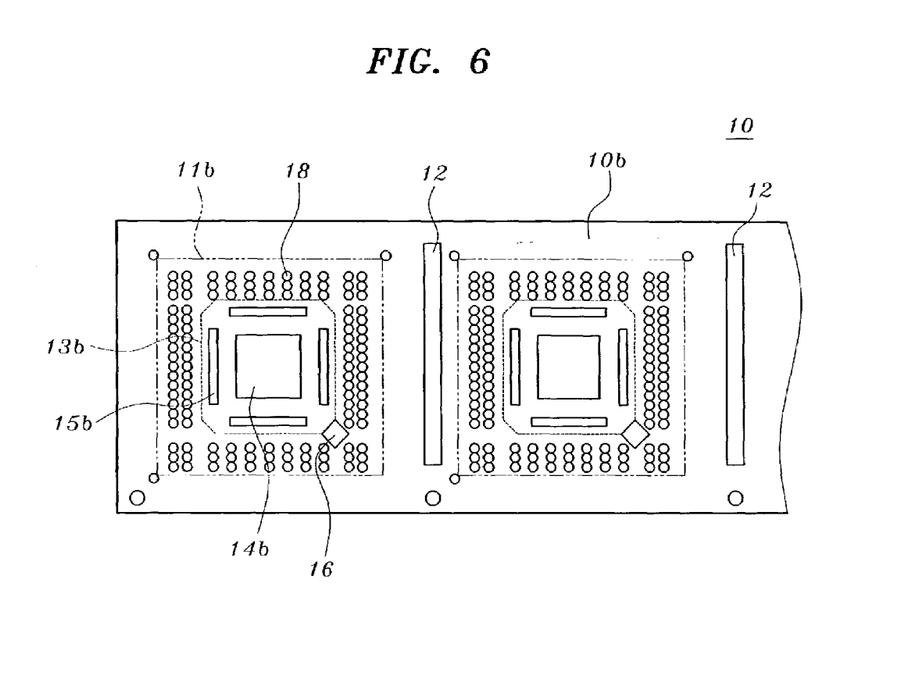
FIG. 6 is a plan view showing the second surface of a double-sided circuit board according to one embodiment of the present invention.

FIG. 5 is a plan view showing a first surface of a double-sided circuit board according to one embodiment of the present invention. FIG. 6 is a plan view showing a second surface of the double-sided mounting circuit board according to one embodiment of the present invention. The circuit boards in FIGS. 5 and 6 are an array type which is suitable for mass production of multi-chip packages.

The circuit board in the array type is separated into a plurality of unit circuit boards along to the slot 12. An electrically conductive wiring pattern is formed on the circuit board 10 but the detailed configuration of the wiring pattern is omitted here. The wiring pattern varies according to the chip. The wiring patterns may be formed on the surfaces or the inside of the circuit board.

The package area 13 and the peripheral area 11 are formed on the first surface 10a of the circuit board 10. The package area 13 comprises the chip mounting area 14 to which the chip is attached and the bonding area 15 connected to the chip by bonding wires. The bonding area 15 is a portion where the bonding pads 70 of FIGS. 2 and 3 are formed. On the other side, the gate hole 16 and the runner area 17 are formed on the peripheral area 11. The gate hole 16 is formed on the boundary between the packaging area 13 and the peripheral area 11, and is a through-hole which passes through the first and second surface 10a and 10b of the circuit board 10. The runner area 17 is formed on the gate hole 16, the peripheral area 11 and the outer boundary of the circuit board 10. This runner area 17 is a path for injecting the molten molding compound to form package body.

In some embodiments as shown in FIG. 6, the package area 13b and the peripheral area 11b are formed on the second surface 10b of the circuit board 10. The package area 13b comprises the chip mounting area 14b to which the chip is attached and the bonding area 15b connected to the chip by bonding wires. Outer connection patterns 18 are formed on the peripheral area 11 b of the second surface 10b and serve to electrically connect the chips attached to the chip mounting area 14 and 14b of the first and second surface. For example, the outer connection pattern 18 may be a solder ball land or the external connection pattern 74 of FIGS. 2 and 3.

The gate hole 16 passes through the circuit board 10. Therefore, the molten molding compound coming from the runner area 17 of the first surface 10a is injected to the first and second surface 10a, 10b through the gate hole 16.

Figure 7A:
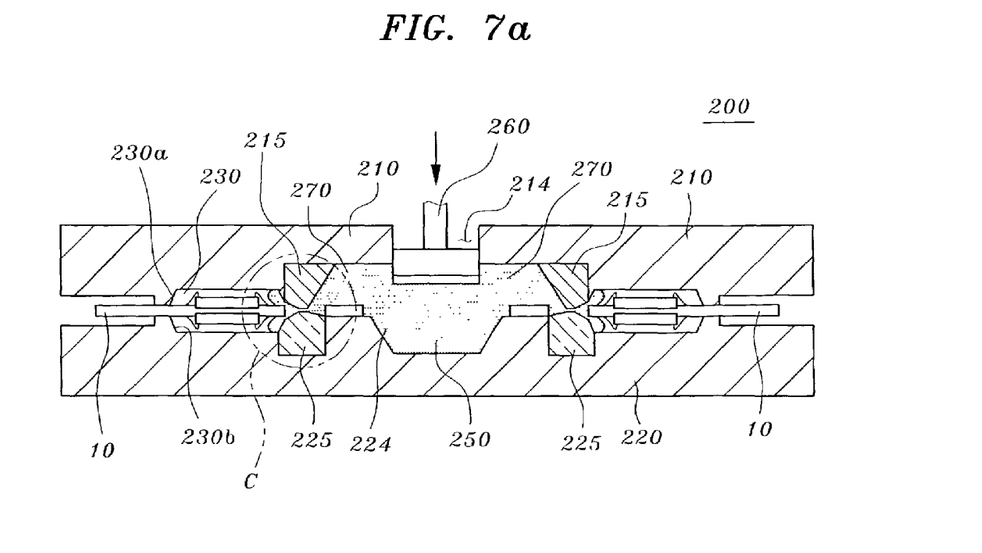
FIG. 7a is a sectional view showing a molding die used in a molding process of the present invention.
Figure 7B:
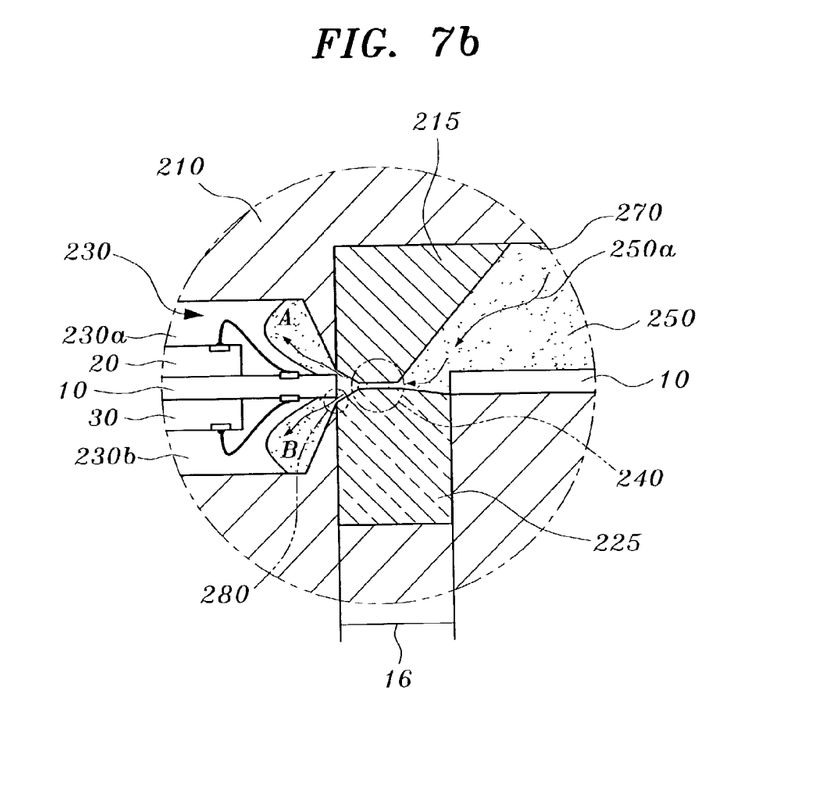

FIG. 7a is a sectional view showing a molding die used in the molding process of the present invention and FIG. 7b is a partially enlarged sectional view of a position C of the molding die of FIG. 7a.

As shown in FIG. 7a, a molding die 200 comprises an upper molding die 210 and a lower molding die 220. The circuit board comprising the upper and lower chips is interposed between the upper molding die 210 and the lower molding die 220. The upper molding die 210 encompasses concave area 230a. The lower molding die 220 encompasses concave area 230b. After closing the upper molding die 210 and the lower molding die 220, the first and second chips 20, 30 are kept in the cavity 230. The cavity 230 is a space for forming the package body (50, 52 of FIG. 2) and is surrounded by the concave areas 230a, 230b.

In some embodiments of the present invention a solid state pellet is positioned on a port 224 of the lower molding die 220. Upper molding die 210 has a through hole 214 through which transfer ram 260 may pass. The runner 270 is formed between the port 224 and the cavity 230.

In some embodiments of the present invention, the circuit board 10 is placed on the molding die 200 so that the second chip 30 is located in the concave area 230b of the lower molding die 220. Pellet 250 is put on the port 224 and the upper molding die 210 is combined with the lower molding die 220. The pellet 250 is compressed by descending the transfer ram 260. At this time, the molten molding compound 250a is injected into the cavity 230 along the runner 270 by heating the molding die 200 and the pellet 250.

The circuit board 10 has gate hole 16 which passes through the circuit board 10. Therefore, the molten molding compound 250a is simultaneously injected into the concave areas 230a, 230b of the upper molding die 210 and the lower molding die 220 along the gate hole 16 (refer to the arrows "A" and "B" in FIG. 7b). The multi-chip package body formed on both the first and second surface of the circuit board 10 is made by one injection of molding compound. Preferably, the concave area 230a of the upper molding die 210 is symmetrical with the concave area 230b of the lower molding die 220.

As shown in FIG. 7b, a gate neck 240 formed by the upper gate piece 215 of the upper molding die 210 and the lower gate piece 225 of the lower molding die 220 is located on the gate hole 16. The gate neck 240 is a narrow pathway along which the molten molding compound 250a passes. Thereby, the molding compound of the runner area 270 can be easily removed after finishing the molding process and the adhesion force between the molding compound and the circuit board near the gate neck 240 does not decreased.

After completely filling the cavity 230 with the molten molding compound 250a, the molding compound 250a is cooled and hardened, the upper and lower molding die 210, 220 are separated from each other. By cutting the circuit board 10 along the slot 12, single multi-chip packages can be obtained.

Although FIG. 7a describes the molding die with two cavities, the molding die may comprise a plurality of cavities connected to radial runners. The number, arrangement and length of the runner 270 are determined by pressure and viscosity of the molten molding compound 250a and size of desired package body.

Figure 8A:
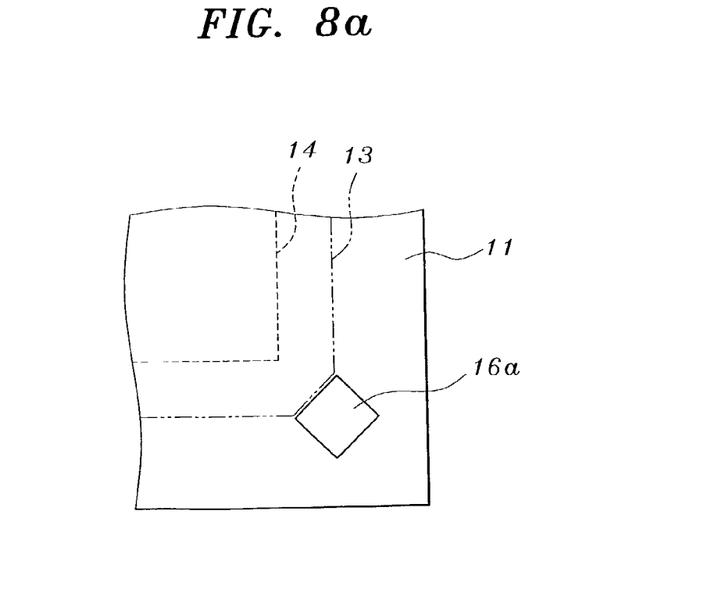
FIGS. 8a to FIG. 8c are plan views showing examples of a gate hole formed on the circuit board of the present invention.
Figure 8B:
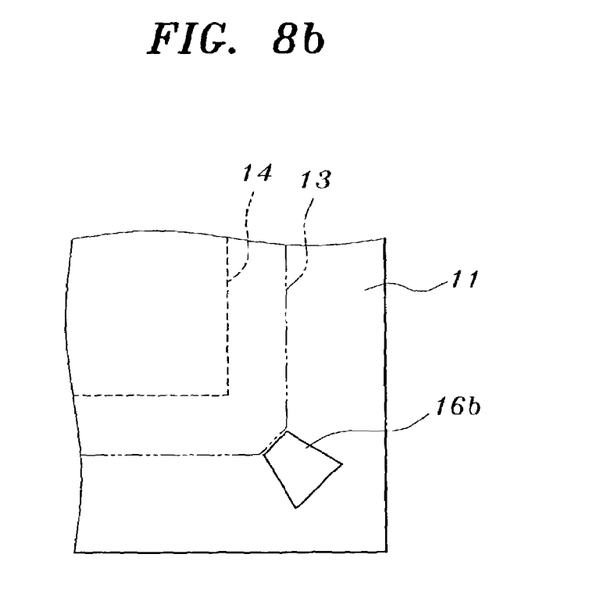
Figure 8C:
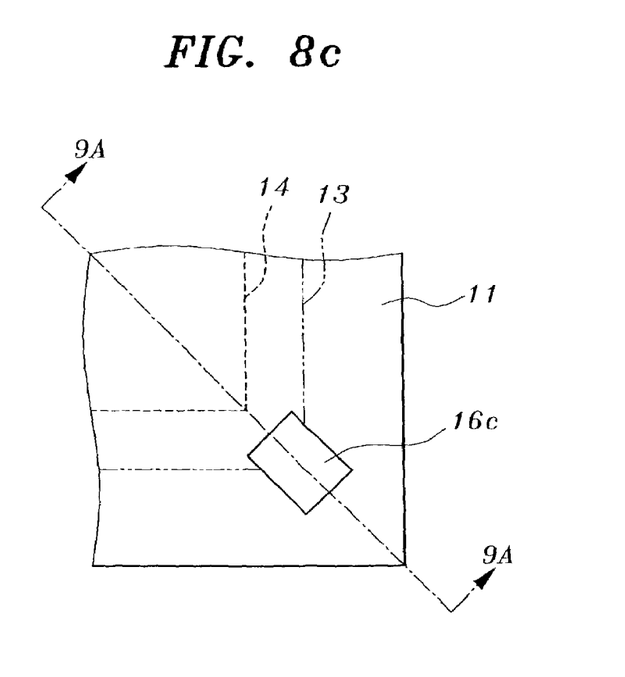

FIG. 8a to FIG. 8c are plan views showing examples of a gate hole formed on the circuit board of the present invention. It is to be understood that other embodiments of the gate hole may be used.

The gate hole 16 can be embodied in various figures on the circuit board 10, 300. For example, the gate hole can be formed, in a plan view, into a square-shaped gate hole 16a as shown in FIG. 8a or a trapezoid-shaped gate hole 16b as shown in FIG. 8b. Alternatively, the gate hole in the peripheral area 11 can be extended to the package area 13 as designated by reference number 16c of FIG. 8c.

In order to facilitate the removal of the molded package body at the gate 280 without the adhesion force between the molded package body and the circuit board, the trapezoid shaped gate hole 16b may be used. Because the gate hole 16b has a gate with a narrow width and a small dimension, a gate neck may not be required.

Figure 9A:
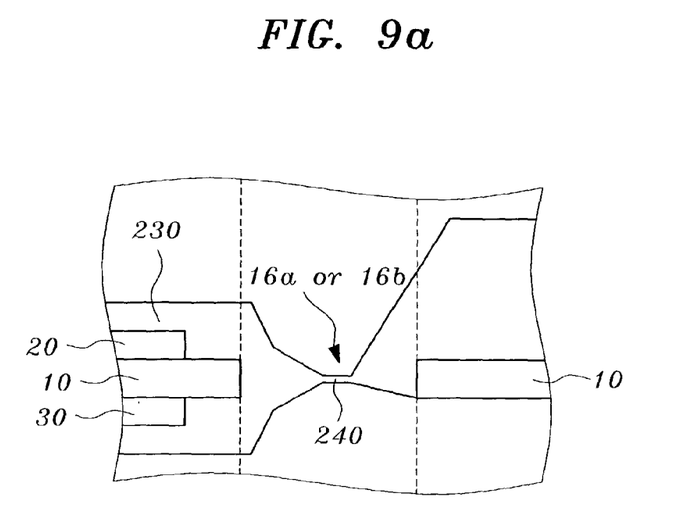
FIGS. 9a and. 9b are detailed sectional views of the molding die of the present invention.

In the case of the square shaped gate hole 16a, 16c, the molten molding compound 250a can easily flow because the width of the gate 280 is broad and the dimension of the gate 280 is large. As shown in FIG. 9a, the gate neck 240 is formed within the gate hole 16a, 16c. Therefore, the molding body of the runner area can be easily removed and the adhesion force between the molding body and the circuit board does not decrease in the gate area. Particularly, the extended gate hole 16c of the square type increases the flowing ability of the molten molding compound 250a passed through gate neck 240 into cavity 230.

Figure 9B:
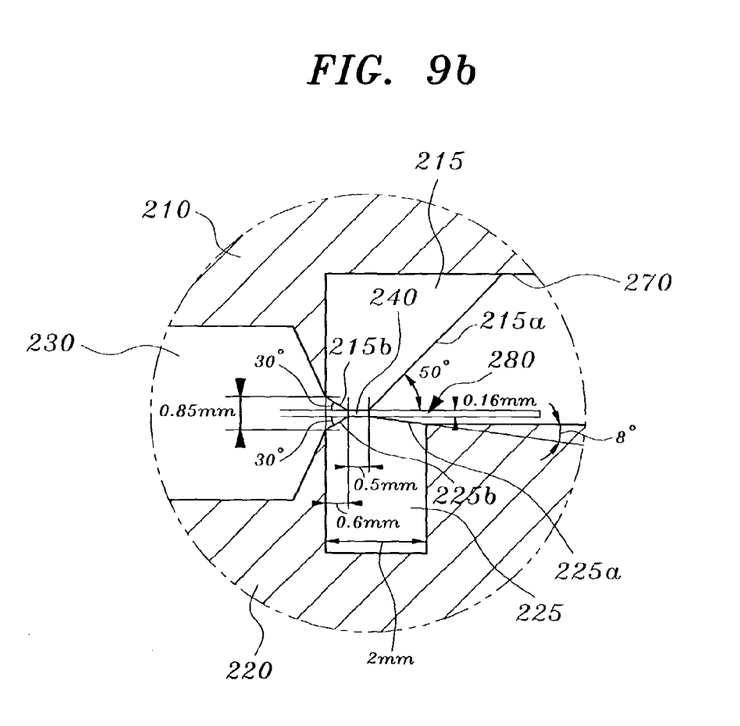

FIG. 9b is an enlarged sectional view of FIG. 9a. In this particular embodiment the gate has a length of the gate is 2 mm.

The upper gate piece 215 comprises a first incline 215a and a second incline 215b. The first incline 215a is connected to the runner 270 and the second incline 215b is connected to the cavity 230. The first incline 215a and the second incline 215b form the upper surface of the gate. The lower gate piece 225 comprises a third incline 225a and a forth incline 225b. The third incline 225a is connected to the runner 270 and the forth incline 225b is connected to the cavity 230. The second incline 225a and the forth incline 225b form the second surface of the gate. The length of the gate neck 240 is 0.5 mm and the height of the gate neck 240 is 0.16 mm. The distance from the gate neck 240 to the cavity 230 is 0.6 mm. The dimension of the cavity 230 is 0.85 mm and the horizontal angle for the second and forth inclines 21 5b, 225b is 30 degrees. The horizontal angle for the first incline 215a is 50 degrees and the horizontal angle for the third incline 225a is 8 degrees.

In some embodiments of the present invention, a multi-chip package having a package body on both surfaces of the circuit board is manufactured by a wire bonding technique and an injection molding technique using conventional plastic package fabrication processes.

Since the package body is formed on both sides of the circuit board by one molding step, the productivity of manufacture of the multi-chip package can be increased.

Further, the multi-chip package of the present invention having the double dies may be thinner than conventional packages.

According to the present invention, mass production of the multi-chip package can be performed without any additional wire looping technique.

According to the present invention, the multi-chip package may use various chips.

Embodiments listed above illustrate, but do not limit, the invention. Although the present invention has been described in detail herein above with respect to the preferred embodiments thereof many variations and/or modifications thereof will be apparent to those of ordinary skill in the art. Therefore, all such variations and modifications are seen to fall within the true spirit and scope of the present invention as defined by the appended claims.

What is claimed is:

1. A circuit board having wiring patterns, comprising:
    a first surface including:
        a first package area having a first chip mounting area to which a first chip is attached, and a first bonding area to which the first chip is electrically connected; and a first peripheral area having a runner area along which a molding compound is injected, and a first gate hole connected to the runner area, and a second surface including:

a second package area having a second chip mounting area to which a second chip is attached, and a second bonding area to which the second chip is electrically connected; and a second peripheral area having external connection patterns electrically connected to the bonding areas through the wiring patterns, and a second gate hole, wherein the first gate hole and the second gate hole are through holes and co-located to form the same hole, the first gate hole and the second gate hole providing a path for a molding compound, used to form a package body within the first and second package areas, respectively, and the first gate hole and the second gate hole are formed only within a first and a second molding area.

2. The circuit board of claim 1, wherein at least one of the chip mounting areas is recessed.

3. The circuit board of claim 1, wherein the gate hole extends to the package areas.

4. The circuit board of claim 1, wherein the gate hole is square in shape.

5. The circuit board of claim 1, wherein the gate hole is trapezoidal in shape.

6. The circuit board of claim 5, wherein the trapezoid-shaped gate hole has a long side facing the runner area.

7. The circuit board of claim 1, wherein each of the bonding areas is electrically connected to each of the chips by bonding wires.

8. The circuit board of claim 1, wherein the external connection patterns are solder ball lands.

9. A multi-chip package comprising:

a circuit board comprising wiring patterns, a first surface and a second surface, the first surface including a first package area having a first chip mounting area and a first bonding area, the first surface further including a first peripheral area having a runner area and a first gate hole, the second surface including a second package area having a second chip mounting area and a second bonding area, the second surface further including a second peripheral area having external connection patterns and a second gate hole, wherein the first gate hole and the second gate hole are through holes and co-located to form a common hole, the first gate hole and the second gate hole providing a path for a molding compound, used to form a package body within the first and second package areas, respectively, and the first gate hole and the second gate hole are formed only within a first and a second molding area;

at least one first chip attached on the first chip mounting area and having a plurality of electrode pads;

at least one second chip attached on the second chip mounting area and having a plurality of electrode pads;

a first electrical connection for providing electrical connection between each chip and each bonding area;

a package body formed on each package area by molding compound injected along the runner area and the gate hole; and a second electrical connection formed on the external connection patterns electrically connected to the bonding area through the wiring patterns so as to provide external connection.

10. The multi-chip package of claim 9, wherein at least one of the chip mounting areas is recessed.

11. The multi-chip package of claim 9, wherein the gate hole extends to the package areas.

12. The multi-chip package of claim 9, wherein the gate hole is square in shape.

13. The multi-chip package of claim 9, wherein the gate hole is trapezoidal in shape.

14. The multi-chip package of claim 9, wherein the first electrical connection is a plurality of bonding wires.

15. The multi-chip package of claim 9, wherein the second electrical connection is a plurality of solder balls.

* * * * *